(12) United States Patent
Park et al.

(10) Patent No.: US 10,062,640 B2
(45) Date of Patent: Aug. 28, 2018

(54) SEMICONDUCTOR DEVICES INCLUDING SEALING REGIONS AND DECOUPLING CAPACITOR REGIONS

(71) Applicant: Samsung Electronics Co., Ltd., Suwon-si, Gyeonggi-do (KR)

(72) Inventors: Chul-yong Park, Hwaseong-si (KR); Jeong-hoon Ahn, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/040,201

(22) Filed: Feb. 10, 2016

(65) Prior Publication Data

US 2016/0240475 A1 Aug. 18, 2016

(30) Foreign Application Priority Data

Feb. 17, 2015 (KR) .................. 10-2015-0024019

(51) Int. Cl.
| | |
|---|---|
| *H01L 29/92* | (2006.01) |
| *H01L 23/48* | (2006.01) |
| *H01L 23/522* | (2006.01) |
| *H01L 23/00* | (2006.01) |
| *H01L 23/58* | (2006.01) |
| *H01L 23/528* | (2006.01) |

(52) U.S. Cl.
CPC ...... *H01L 23/5223* (2013.01); *H01L 23/5286* (2013.01); *H01L 23/562* (2013.01); *H01L 23/564* (2013.01); *H01L 23/585* (2013.01)

(58) Field of Classification Search
CPC ... H01L 21/78; H01L 21/304; H01L 2021/60; H01L 21/48; H01L 21/06; H01L 21/326; H01L 21/67005; H01L 21/50; H01L 23/00; H01L 23/544; H01L 25/00; H01L 22/00; H01L 24/00; H01L 23/522; H01L 23/5222; H01L 23/53295; G06K 9/00006
See application file for complete search history.

(56) References Cited

U.S. PATENT DOCUMENTS

| | | | |
|---|---|---|---|
| 5,776,826 A | 7/1998 | Mitwalsky | |
| 5,834,829 A * | 11/1998 | Dinkel | ............ H01L 21/78 257/508 |
| 6,365,958 B1 * | 4/2002 | Ibnabdeljalil | ...... H01L 23/562 257/619 |

(Continued)

FOREIGN PATENT DOCUMENTS

| | | |
|---|---|---|
| JP | 2006-351878 | 12/2006 |
| JP | 2008-071931 | 3/2008 |

(Continued)

*Primary Examiner* — Mary Wilczewski
*Assistant Examiner* — Tsz Chiu
(74) *Attorney, Agent, or Firm* — Myers Bigel, P.A.

(57) ABSTRACT

Semiconductor devices may include an internal circuit, a sealing region surrounding the internal circuit, and a decoupling capacitor region in the sealing region. The decoupling capacitor region may include decoupling capacitors. Each of the decoupling capacitors may include a first capacitor metal wiring pattern connected to a high power supply line, a second capacitor metal wiring pattern spaced apart from the first capacitor metal wiring pattern and connected to a low power supply line, and a dielectric pattern between the first capacitor metal wiring pattern and the second capacitor metal wiring pattern.

16 Claims, 19 Drawing Sheets

(56) References Cited

U.S. PATENT DOCUMENTS

| | | |
|---|---|---|
| 7,462,912 B2 | 12/2008 | Ahn et al. |
| 7,538,433 B2 * | 5/2009 | Takemura ......... H01L 21/76832 257/750 |
| 7,652,377 B2 | 1/2010 | Yaegashi et al. |
| 7,812,424 B2 * | 10/2010 | Barth ................. H01L 23/5223 257/532 |
| 7,888,776 B2 | 2/2011 | Ogawa et al. |
| 8,125,054 B2 | 2/2012 | West et al. |
| 8,138,607 B2 * | 3/2012 | Collins ............... H01L 23/522 257/758 |
| 2003/0032263 A1 * | 2/2003 | Nagao .................... H01L 22/32 438/462 |
| 2007/0102787 A1 * | 5/2007 | Goebel .............. H01L 23/5223 257/532 |
| 2009/0160020 A1 * | 6/2009 | Barth ................. H01L 23/5223 257/532 |
| 2009/0230524 A1 * | 9/2009 | Chien ................ H01L 21/4832 257/676 |
| 2013/0062727 A1 | 3/2013 | Huang et al. |
| 2014/0264767 A1 | 9/2014 | Gratz et al. |

FOREIGN PATENT DOCUMENTS

| | | |
|---|---|---|
| KR | 100469911 | 1/2005 |
| KR | 1020090070034 | 7/2009 |

* cited by examiner

SEMICONDUCTOR DEVICES INCLUDING SEALING REGIONS AND DECOUPLING CAPACITOR REGIONS

CROSS-REFERENCE TO RELATED APPLICATION

This application claims priority under 35 U.S.C. § 119 to Korean Patent Application No. 10-2015-0024019, filed on Feb. 17, 2015, in the Korean Intellectual Property Office, the disclosure of which is incorporated herein by reference in its entirety.

BACKGROUND

The disclosure relates to a semiconductor device, and more particularly, to a semiconductor device including a sealing region and a decoupling capacitor region.

A semiconductor device (e.g., a semiconductor chip or a semiconductor die) may include a decoupling capacitor region in which a decoupling capacitor for removing power supply noise is formed. Furthermore, the semiconductor device may include a sealing region for protecting internal circuits when a semiconductor device is manufactured by dicing a plurality of semiconductor devices fabricated on a semiconductor wafer or packaging semiconductor devices.

SUMMARY

Provided are semiconductor devices including decoupling capacitor regions and sealing regions so that the efficiency of the semiconductor devices is increased, a chip size (device size) of the semiconductor devices is reduced, and a design efficiency of the semiconductor devices is improved.

Additional aspects will be set forth in part in the description which follows and, in part, will be apparent from the description, or may be learned by practice of the presented example embodiments.

According to some embodiments, a semiconductor device includes an internal circuit; a sealing region, which surrounds the internal circuit; and a decoupling capacitor region, which is arranged in the sealing region.

The sealing region includes a moisture oxidation barrier region, which surrounds the internal circuit; and a crack stop region, which is spaced apart from the moisture oxidation barrier region and surrounds the moisture oxidation barrier region. The moisture oxidation barrier region has a polygonal ring-like shape with chamfered corners. A crack stop aiding region is formed in the crack stop region.

The decoupling capacitor region is formed in at least one of the crack stop region and the moisture oxidation barrier region. The decoupling capacitor region includes capacitor metal wiring layers, and the capacitor metal wiring layers are electrically connected to internal metal wiring layers in the internal circuit via connecting metal wiring layers extending from the moisture oxidation barrier region or the crack stop region.

The decoupling capacitor region includes decoupling capacitors, each of the decoupling capacitor including a first capacitor metal wiring pattern connected to a high power supply line; a second capacitor metal wiring pattern, which is spaced apart from the first capacitor metal wiring pattern and is connected to a low power supply line; and a dielectric pattern, which is interposed between the first capacitor metal wiring pattern and the second capacitor metal wiring pattern.

The first capacitor metal wiring pattern includes a first base pattern arranged in a first direction and a plurality of first extending patterns, which extend from the first base pattern in a second direction perpendicular to the first direction and are spaced apart from one another, and the second capacitor metal wiring pattern includes a second base pattern, which faces the first base pattern in the second direction and is arranged in the first direction, and a plurality of second extending patterns, which extend from the second base pattern into spaces between the first extending patterns in the second direction and are spaced apart from one another.

The decoupling capacitor region includes a plurality of unit decoupling capacitor regions that are arranged to be spaced apart from one another.

According to some embodiments, a semiconductor device includes an internal circuit, which is formed on a semiconductor substrate; a sealing region, which is formed on the semiconductor substrate to surround the internal circuit; and a decoupling capacitor region, which includes a plurality of decoupling capacitor layers stacked on a portion of the semiconductor substrate in the sealing region, wherein the plurality of decoupling capacitor layers include a plurality of capacitor metal wiring patterns, which are arrange to be spaced apart from one another, and dielectric patterns formed between the capacitor metal wiring patterns.

The sealing region includes a moisture oxidation barrier region, which surrounds the internal circuit, and a crack stop region, which is spaced apart from the moisture oxidation barrier region and surrounds the moisture oxidation barrier region, and wherein the sealing region includes a plurality of metal wiring layers formed in a portion of the semiconductor substrate and metal vias interconnecting the metal wiring layers and formed in inter-metal insulation layers between the metal wiring layers.

The decoupling capacitor region is formed in at least one of the crack stop region and the moisture oxidation barrier region.

The capacitor metal wiring patterns constituting the decoupling capacitor region include first capacitor metal wiring patterns connected to a high power supply line; and second capacitor metal wiring patterns, which are spaced apart from the first capacitor metal wiring patterns and are connected to a low power supply line, and dielectric patterns are formed between the first capacitor metal wiring patterns and the second capacitor metal wiring patterns.

The decoupling capacitor region includes a first decoupling capacitor layer and a second decoupling capacitor layer arranged on the first decoupling capacitor layer, the capacitor metal wiring patterns constituting the first decoupling capacitor layer are arranged on a plane in a first direction, and the capacitor metal wiring patterns constituting the second decoupling capacitor layer are arranged on a plane in a second direction perpendicular to the first direction.

Inter-metal insulation layer are formed between the capacitor metal wiring patterns and the dielectric patterns, and capacitor metal vias interconnecting the decoupling capacitor layers are formed in the inter-metal insulation layers.

According to some embodiments, a semiconductor device includes an internal circuit, which is formed on a semiconductor substrate; a sealing region, which surrounds the internal circuit and includes a plurality of metal wiring layers formed on the semiconductor substrate; and a plurality of metal vias, which are formed at first inter-metal insulation layers between the metal wiring layers and interconnect the metal wiring layers; and a decoupling capacitor region, which is arranged in the sealing region and includes a plurality of capacitor metal wiring layers formed on the semiconductor substrate; dielectric patterns formed between capacitor metal wiring patterns constituting the capacitor metal wiring layers; and capacitor metal vias, which are formed in second inter-metal insulation layers between the capacitor metal wiring layers and interconnect the capacitor metal wiring layers.

The sealing region includes a moisture oxidation barrier region, which surrounds the internal circuit; and a crack stop region, which is spaced apart from the moisture oxidation barrier region and surrounds the moisture oxidation barrier region. The crack stop region is larger than the moisture oxidation barrier region, and the decoupling capacitor region is formed in the crack stop region.

The decoupling capacitor layers include first capacitor metal wiring patterns connected to a high power supply line; and second capacitor metal wiring patterns, which are spaced apart from the first capacitor metal wiring patterns and are connected to a low power supply line, and dielectric patterns are formed between the first capacitor metal wiring patterns and the second capacitor metal wiring patterns.

The capacitor metal wiring layers are electrically connected to metal wiring layers in the internal circuit via connecting metal wiring layers.

BRIEF DESCRIPTION OF THE DRAWINGS

These and/or other aspects will become apparent and more readily appreciated from the following description of the example embodiments taken in conjunction with the accompanying drawings in which.

DETAILED DESCRIPTION

Figure 1:
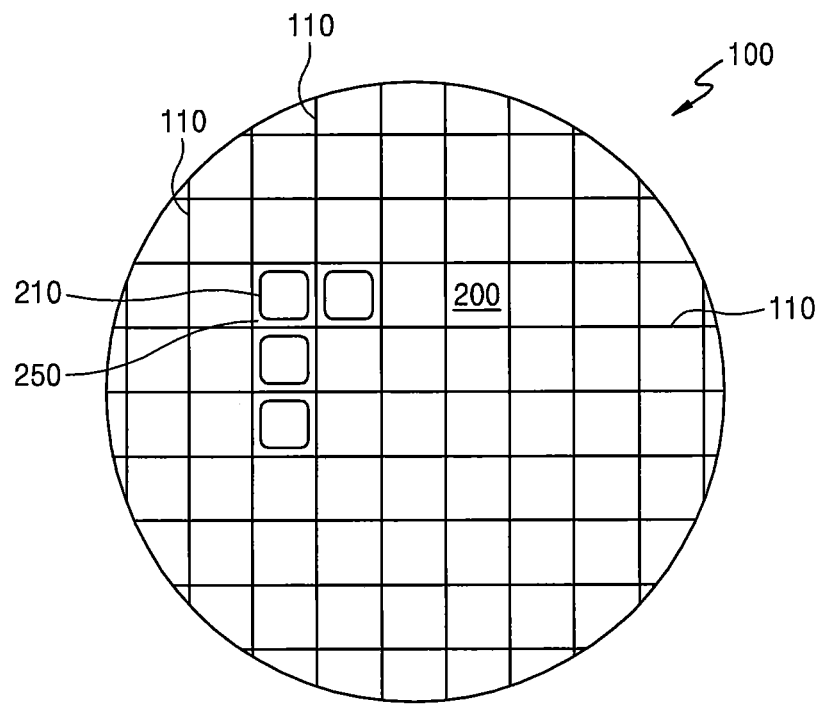
FIG. 1 is a plan view of a semiconductor wafer according to example embodiments.

Example embodiments are described below with reference to the accompanying drawings. Like reference numerals refer to like elements throughout. Example embodiments may have different forms and should not be construed as being limited to the descriptions set forth herein. As used herein, the term "and/or" includes any and all combinations of one or more of the associated listed items. Expressions such as "at least one of," when preceding a list of elements, modify the entire list of elements and do not modify the individual elements of the list. In the drawings, lengths and sizes of layers and regions may be exaggerated for clarity It will be understood that when an element or layer is referred to as being "on" another element or layer, the element or layer can be directly on another element or layer or intervening elements or layers. In contrast, when an element is referred to as being "directly on" another element or layer, there are no intervening elements or layers present.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "below" or "lower" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "below" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof.

Example embodiments are described herein with reference to cross-sectional or plan illustrations that are schematic illustrations of idealized embodiments (and intermediate structures) of the inventive concepts. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing.

FIG. 1 is a plan view of a semiconductor wafer 100 according to example embodiments.

In detail, a plurality of semiconductor devices 200 are fabricated on the semiconductor wafer 100. The semiconductor devices 200 may be referred to as semiconductor dies or semiconductor chips. After fabricating the plurality of semiconductor devices 200 on the semiconductor wafer 100, the plurality of semiconductor devices 200 are separated into individual semiconductor devices 200 by dicing the semiconductor wafer 100 in a wafer dicing operation.

In the wafer dicing operation, the semiconductor wafer 100 is diced along scribe lines 110 by using a dicing blade. When the semiconductor wafer 100 is diced, cracks are formed in inter-metal insulation layers constituting the semiconductor devices 200, and the cracks extend from edges of the semiconductor devices 200 to internal circuits (210, active circuit regions). Therefore, a sealing region 250 is needed to reduce or possibly prevent this problem. Furthermore, the sealing region 250 is needed to reduce or possibly prevent the semiconductor devices 200 from being damaged by moisture that permeates from surfaces of the inter-metal insulation layers.

The sealing region 250 is a region for protecting the internal circuit 210 and may be arranged to surround the sealing region 250. The sealing region 250 may be referred to as a die seal region, a die seal ring region, or a guard ring region.

The sealing region 250 may occupy a significant portion of the semiconductor device 200. Therefore, as described below, a decoupling capacitor region occupied by decoupling capacitors for removing power supply noise may be arranged in the sealing region 250. In this case, the overall size of a semiconductor device may be reduced and also the design efficiency may be improved.

Figure 2:
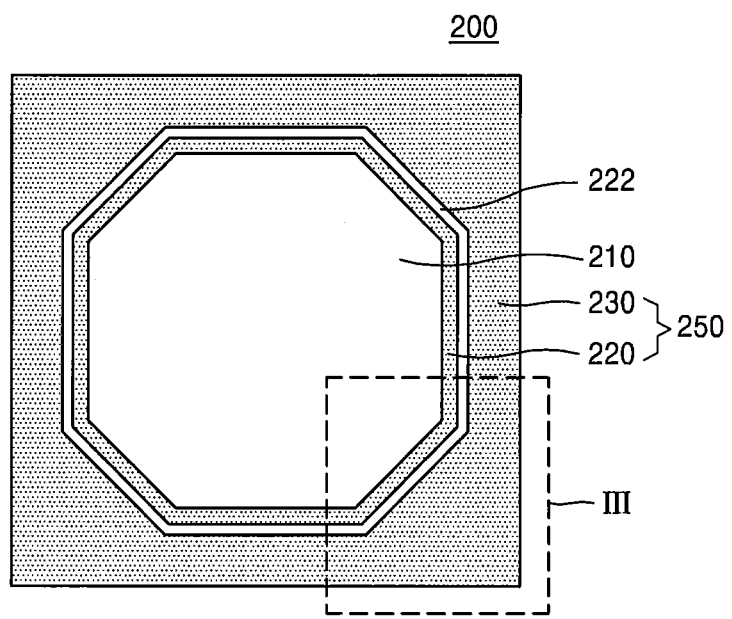
FIG. 2 is a plan view of a semiconductor device according to example embodiments.
Figure 3:
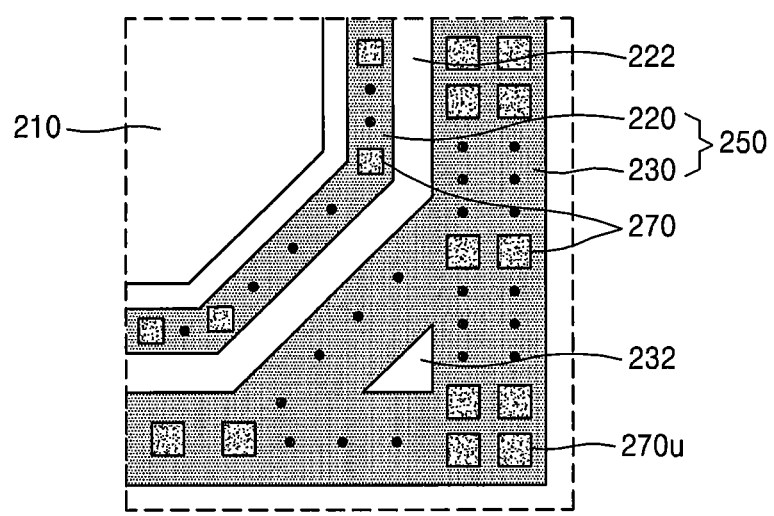
FIG. 3 is a plan view of the portion III of FIG. 2.

FIG. 2 is a plan view of a semiconductor device 200 according to example embodiments, and FIG. 3 is a plan view of the portion III of FIG. 2.

In detail, as shown in FIGS. 2 and 3, the semiconductor device 200 includes the internal circuit 210, the sealing region 250 surrounding the internal circuit 210, and a decoupling capacitor region 270 arranged in the sealing region 250. The internal circuit 210 may include a decoder, a calculating circuit, an input/output circuit, a memory circuit, etc.

The sealing region 250 may include a moisture oxidation barrier region 220 surrounding the internal circuit 210 and a crack stop region 230, which is spaced apart from the moisture oxidation barrier region 220 and surrounds the moisture oxidation barrier region 220. According to example embodiments, the crack stop region 230 may be greater than the moisture oxidation barrier region 220.

Although the moisture oxidation barrier region is denoted by the reference numeral 220 and the crack stop region is denoted by the reference numeral 230 for convenience, the reference numeral 220 may denote a crack stop region and the reference numeral 230 may refer to a moisture oxidation barrier region instead. A buffer region 222 including an insulation layer may be formed between the moisture oxidation barrier region 220 and the crack stop region 230.

The moisture oxidation barrier region 220 may be formed to reduce or possibly prevent the internal circuit 210 from being oxidized due to permeation of moisture or air from the outside. According to example embodiments, the moisture oxidation barrier region 220 may have a polygonal ring-like shape with chamfered corners.

The crack stop region 230 may be formed to reduce or possibly prevent expansion of cracks formed when a semiconductor wafer is diced. According to example embodiments, as shown in FIG. 3, a crack stop aiding region 232 including an insulation layer may be formed in the crack stop region 230. The crack stop aiding region 232 may be formed to buffer during expansion or contraction of the crack stop region 230.

According to example embodiments, as shown in FIG. 3, the decoupling capacitor region 270 for removing noise of a power supply line may be formed in the moisture oxidation barrier region 220 and the crack stop region 230 constituting the sealing region 250. According to example embodiments, the decoupling capacitor region 270 may be formed in the moisture oxidation barrier region 220 or the crack stop region 230. According to example embodiments, the decoupling capacitor region 270 may include a plurality of unit decoupling capacitor regions 270 that are spaced apart from one another.

As described above, the decoupling capacitor region 270 including decoupling capacitors for removing power supply noise may be arranged inside the sealing region 250.

As described above, device efficiency of the semiconductor device 200 may be improved by arranging the decoupling capacitor region 270 in the sealing region 250 at the outer portion of the semiconductor device 200.

Furthermore, since it is not necessary to form the decoupling capacitor region 270 in the internal circuit 210 of the semiconductor device 200, an area occupied by the internal circuit 210 may be reduced. Therefore, the overall device size (chip size) may be reduced, and design efficiency may be improved.

Here, a method of removing power supply noise using a decoupling capacitor will be described with reference to FIGS. 4 and 5.

Figure 4:
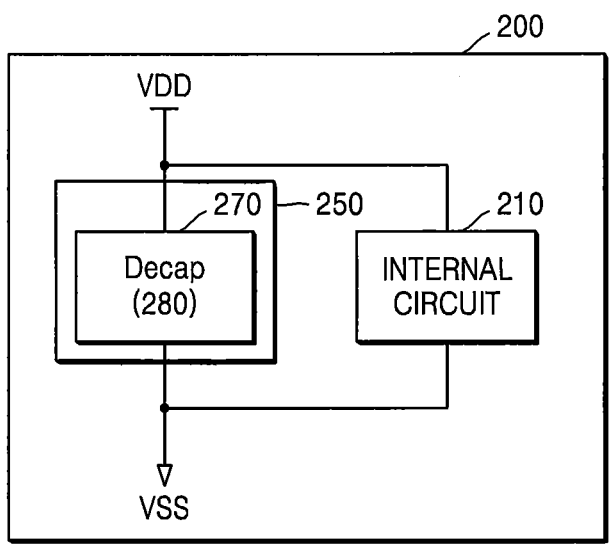
FIG. 4 is a block diagram of a semiconductor device in which a decoupling capacitor region is arranged in a sealing region, according to example embodiments.

FIG. 4 is a block diagram of a semiconductor device in which the decoupling capacitor region 270 is arranged in the sealing region 250, according to example embodiments.

In detail, the semiconductor device 200 may include the internal circuit 210 and the decoupling capacitor region 270 that is arranged in the sealing region 250. A decoupling capacitor (Decap) 280 included in the decoupling capacitor region 270 may be connected between a high power voltage VDD and a low power voltage VSS. The decoupling capacitor 280 included in the decoupling capacitor region 270 may stabilize the high power voltage VDD and provide the stabilized high power voltage VDD to the internal circuit 210, thereby reducing power supply noise of the semiconductor device 200.

Figure 5:
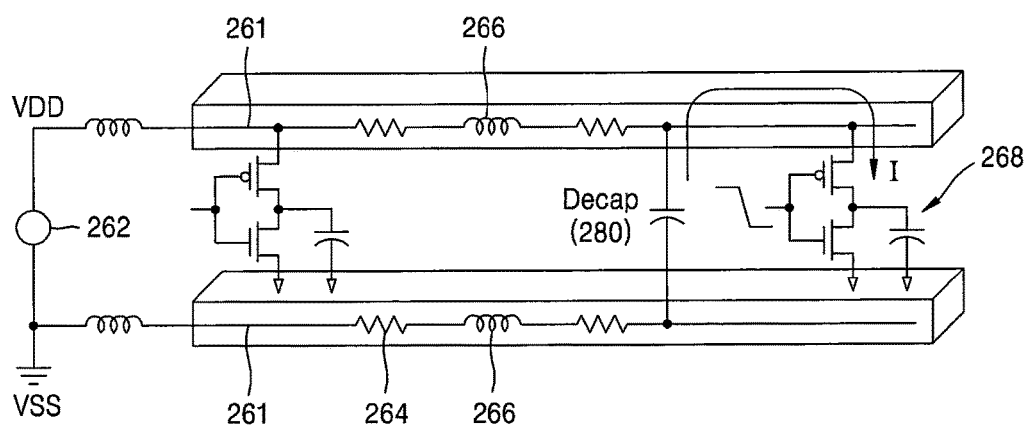
FIG. 5 is a schematic diagram illustrating a method for removing power supply noise of a semiconductor device, according to example embodiments.

FIG. 5 is a diagram illustrating a method of removing power supply noise from a semiconductor device, according to example embodiments.

In detail, power supply noise occurs on the power supply line 261 and is caused by a voltage drop of power supply voltages VDD and VSS supplied by a power source 262. The power supply noise may also be caused by a voltage drop due to a resistance 264 of the power supply line 261 and a voltage drop due to an inductance 266. If the power supply noise occurs, an internal circuit (210 of FIG. 4) or a circuit element 268 may malfunction and delay time may be increased.

Power supply noise problem may be resolved using the decoupling capacitor 280. The decoupling capacitor 280 is arranged around the circuit element 268 at which power supply noise occurs, so that a current I for the circuit element 268 is supplied from the decoupling capacitor 280. Therefore, a current flowing through the power supply line 261 decreases, and thus, the power supply noise may be reduced in proportion to the reduced current.

Figure 6:
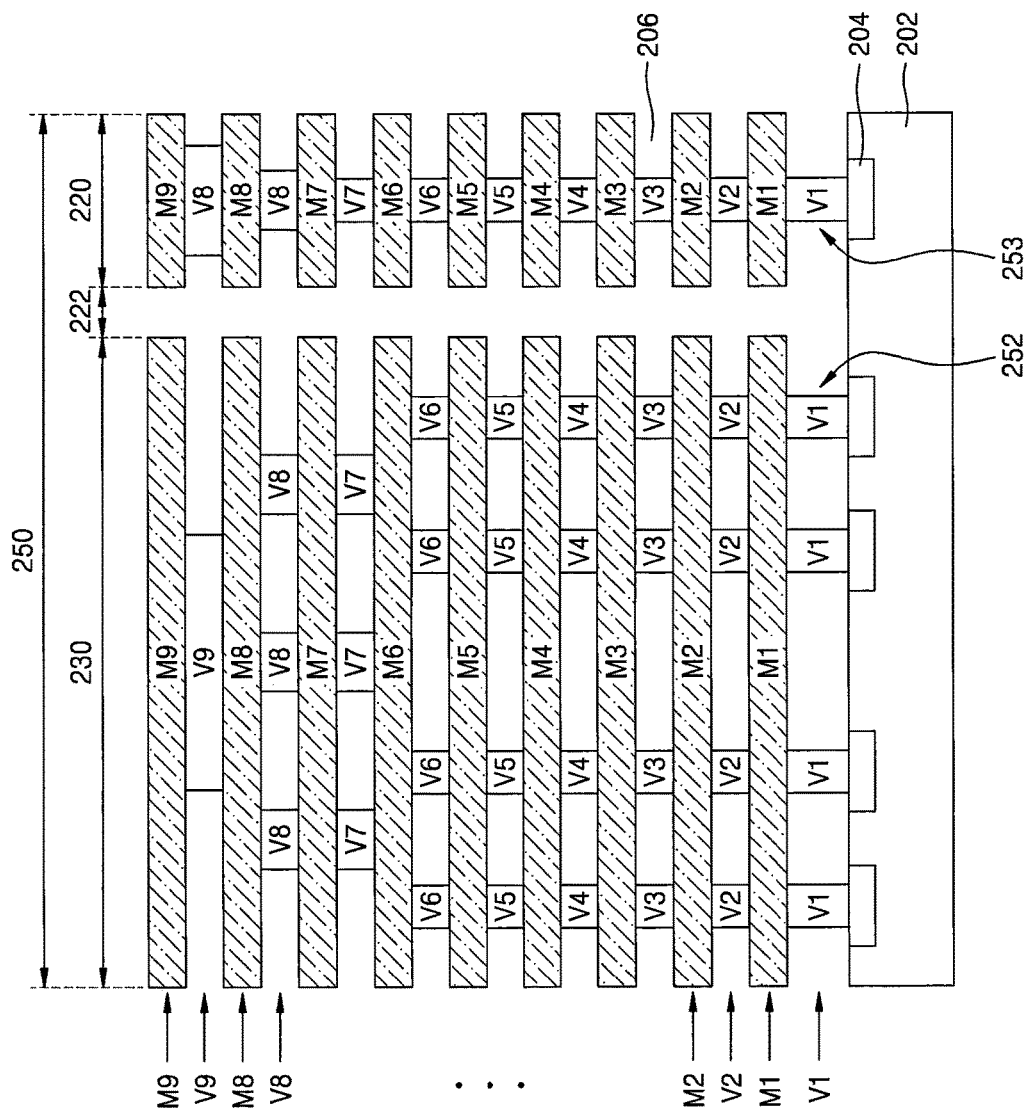
FIG. 6 is a sectional view of a sealing region of a semiconductor device according to example embodiments.

FIG. 6 is a sectional view of a sealing region of a semiconductor device according to example embodiments.

In detail, as described above, the sealing region 250 may include the moisture oxidation barrier region 220 and the crack stop region 230 that is separated from the moisture oxidation barrier region 220 by the buffer region 222. The moisture oxidation barrier region 220 may be formed to surround the internal circuit 210. The outer portion of the crack stop region 230 may correspond to die edges (edges of a chip). For convenience of explanation, FIG. 6 shows that the crack stop region 230 includes four crack stop lines 252. Furthermore, for convenience of explanation, FIG. 6 shows that the moisture oxidation barrier region 220 includes one moisture oxidation barrier line 253.

The sealing region 250 may include multilayer-leveled metal wiring layers M1 through M9 and metal vias V1 through V9 that are formed in inter-metal insulation layers 206 formed between the metal wiring layers M1 through M9. An impurity region 204 (that is, an active region) may be formed on a semiconductor substrate 202. The metal wiring layers M1 through M9 may be electrically connected to one another via the metal vias V1 through V9. A contact pad may be formed on the topmost metal wiring layer M9. The numbers of the metal wiring layers M1 through M9 and the metal vias V1 through V9 are just examples for convenience of explanation. Furthermore, the numbers of the metal vias V1 through V9 formed in the inter-metal insulation layers 206 are also just examples for convenience of explanation.

The inter-metal insulation layer 206 may be formed of an oxide, an organo-silicate glass, an organic material, an inorganic material, a low-K material, or a super low-K material. The low-K material may refer to a material with a dielectric constant less than 4. The super low-K material may refer to a material with a dielectric constant less than 2.5. The inter-metal insulation layer 206 may be formed of a porous material or a non-porous material.

The metal wiring layers M1 through M9 and the metal vias V1 through V9 may be formed of copper, tungsten, aluminum, silver, gold, or an alloy thereof. The semiconductor substrate 202 may be a silicon substrate, a silicon-on-insulator (SOI) substrate, a gallium arsenic substrate, or a silicon germanium substrate.

Figure 7:
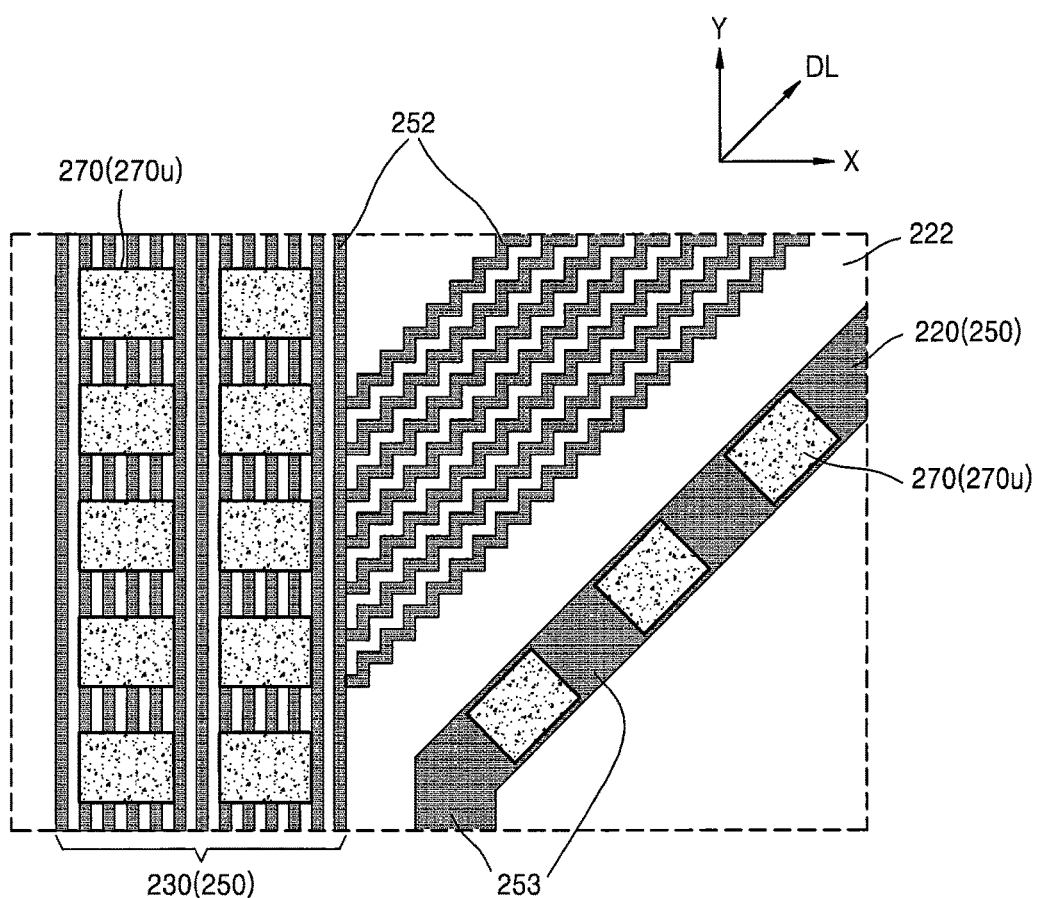
FIG. 7 is a plan view of a sealing region and a decoupling capacitor region of a semiconductor device according to example embodiments.

FIG. 7 is a plan view of a sealing region and a decoupling capacitor region of a semiconductor device according to example embodiments.

In detail, FIG. 7 is a partially magnified diagram of FIG. 3. As described above, the decoupling capacitor region 270 is formed in the crack stop region 230 and the moisture oxidation barrier region 220 constituting the sealing region 250. The crack stop region 230 and the moisture oxidation barrier region 220 are separated from each other by the buffer region 222.

As shown in FIG. 7, the decoupling capacitor region 270 may be formed in both the moisture oxidation barrier region 220 and the crack stop region 230. Furthermore, the decoupling capacitor region 270 may be formed in either the moisture oxidation barrier region 220 or the crack stop region 230 unlike as shown in FIG. 7. The decoupling capacitor region 270 may include the plurality of unit decoupling capacitor regions 270 that are spaced apart from one another.

The crack stop region 230 may include the plurality of crack stop lines 252. The crack stop lines 252 may be formed in a plane in an arbitrary direction, e.g., the y-axis direction perpendicular to the x-axis direction. The crack stop lines 252 may also be formed in a plane in a diagonal direction (DL).

The moisture oxidation barrier region 220 may include one moisture oxidation barrier line 253. Although FIG. 7 shows that the moisture oxidation barrier region 220 includes only one moisture oxidation barrier line 253 for convenience, the moisture oxidation barrier region 220 may include a plurality of moisture oxidation barrier lines 253. The moisture oxidation barrier line 253 may be formed in a plane in an arbitrary direction, e.g., the y-axis direction. The moisture oxidation barrier line 253 may also be formed in a plane in a diagonal direction (DL).

Figure 8:
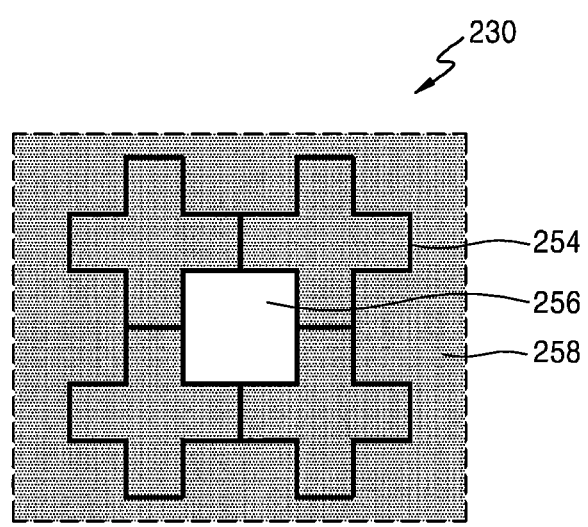
FIGS. 8 through 10 are plan views of portions of a sealing region of a semiconductor device according to example embodiments.
Figure 9:
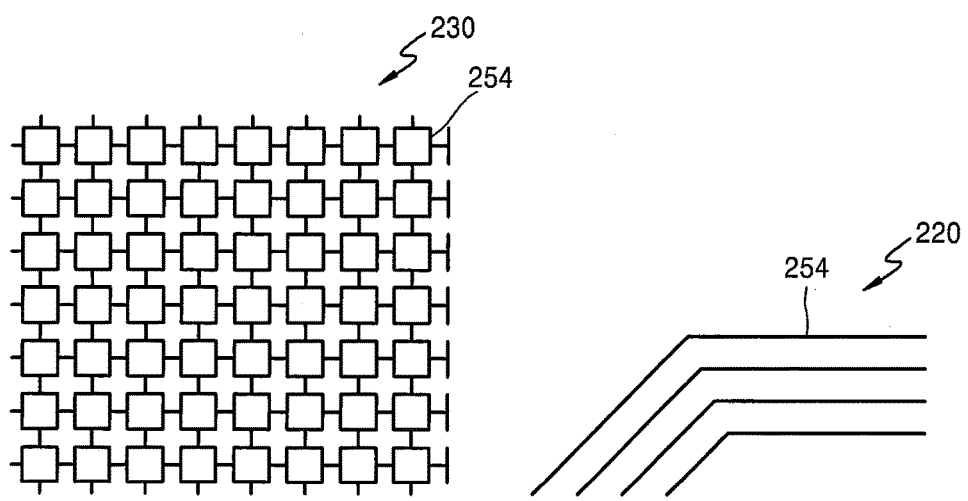
Figure 10:
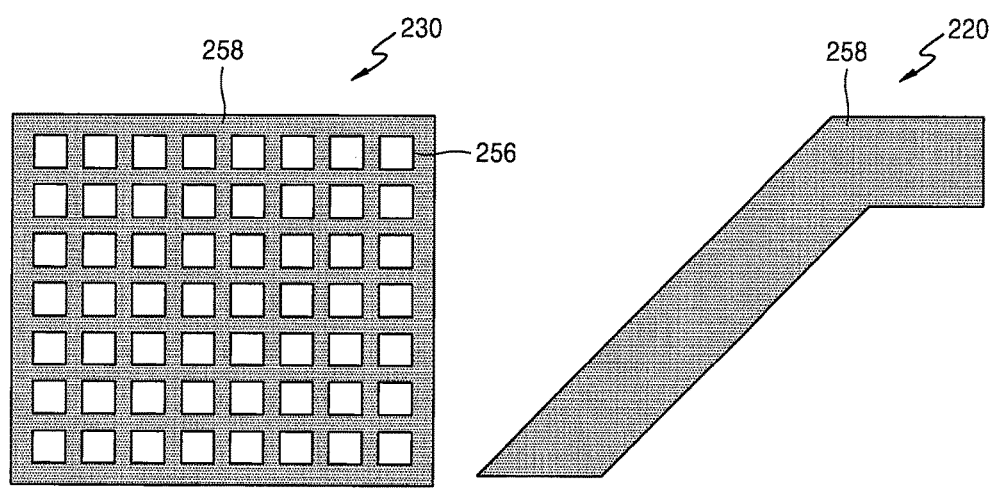

FIGS. 8 through 10 are plan views of portions of a sealing region of a semiconductor device according to example embodiments.

In detail, FIG. 8 is a plan view showing the crack stop region 230 of the sealing region 250 at a level, e.g., the metal via V2 level. FIGS. 9 and 10 are plan views showing the crack stop region 230 and the moisture oxidation barrier region 220 constituting the sealing region 250 at a level from among levels of the metal vias V1 through V9, e.g., the metal via V2 level.

As shown in FIG. 9, metal vias 254 in the crack stop region 230 may have a shape including a plurality of rectangles connected to one another. As shown in FIG. 9, the metal vias 254 in the moisture oxidation barrier region 220 may have linear shapes.

As shown in FIG. 8, an inter-metal insulation layer 256 may be formed within a rectangular portion of the crack stop region 230. As shown in FIGS. 8 and 10, portion of the crack stop region 230 other than the inter-metal insulation layer 256 may be formed as a metal wiring layer 258. As shown in FIG. 10, the metal wiring layer 258 may be formed throughout the moisture oxidation barrier region 220.

Figure 11:
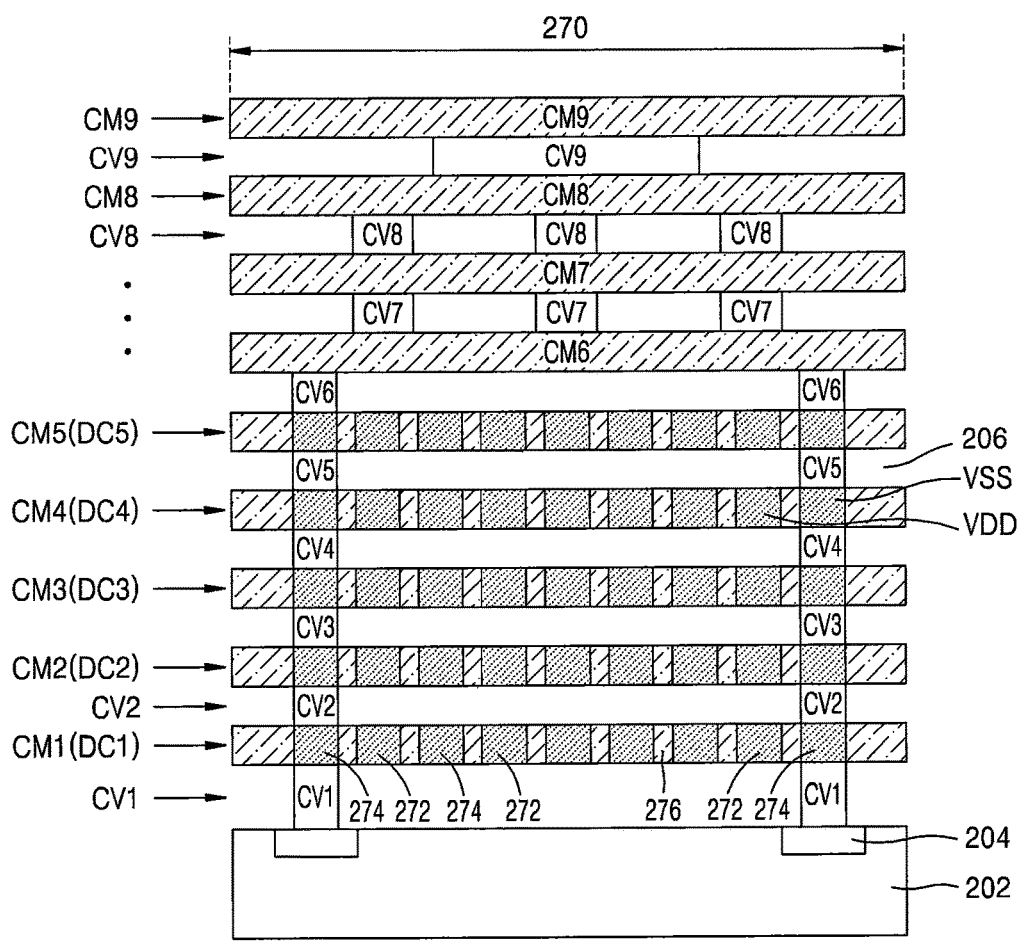
FIG. 11 is a sectional view of a decoupling capacitor region of a semiconductor device according to example embodiments.

FIG. 11 is a sectional view of a decoupling capacitor region of a semiconductor device according to example embodiments.

In detail, FIG. 11 may be a sectional view diagram showing a portion of the decoupling capacitor region 270 of FIG. 3. As described above, the decoupling capacitor region 270 may be located in a sealing region (250 of FIGS. 2 and 3). The decoupling capacitor region 270 may include a plurality of decoupling capacitor layers DC1 through DC5 formed on the semiconductor substrate 202. Although FIG. 11 shows the five decoupling capacitor layers DC1 through DC5 for convenience of explanation, the inventive concepts are not limited thereto. The impurity region 204 may be formed on the semiconductor substrate 202.

Each of the decoupling capacitor layers DC1 through DC5 may include a plurality of capacitor metal wiring patterns 272 and 274 that are arranged to be spaced apart from each other and dielectric patterns 276 formed between the capacitor metal wiring patterns 272 and 274.

The capacitor metal wiring patterns 272 and 274 may include a first capacitor metal wiring pattern 272 connected to a high power supply line (that is, VDD) and a second capacitor metal wiring pattern 274, which is connected to a low power supply line (that is, VSS) and is spaced apart from the first capacitor metal wiring pattern 272. The dielectric patterns 276 may be interposed between the first capacitor metal wiring pattern 272 and the second capacitor metal wiring pattern 274.

The inter-metal insulation layers 206 are formed on the capacitor metal wiring patterns 272 and 274 and the dielectric pattern 276, and capacitor metal vias CV2 through CV5 connecting the decoupling capacitor layers DC1 through DC5 to one another may be formed in the inter-metal insulation layers 206.

In some embodiments, the decoupling capacitor region 270 may include multilayer-leveled capacitor metal wiring layers CM1 through CM9 formed on the semiconductor substrate 202, dielectric patterns 276 formed between the capacitor metal wiring patterns 272 and 274 constituting some capacitor metal wiring layers (one of capacitor metal wiring layers CM1 through CM5) from among the multilayer-leveled capacitor metal wiring layers CM1 through CM9, the inter-metal insulation layers 206 formed between the capacitor metal wiring layers CM1 through CM9, and capacitor metal vias CV1 through CV9 formed in the inter-metal insulation layers 206. As described above, the capacitor metal wiring layers CM1 through CM9 may include the first capacitor metal wiring pattern 272 and the second capacitor metal wiring pattern 274. The dielectric pattern 276 may be arranged between the first capacitor metal wiring pattern 272 and the second capacitor metal wiring pattern 274.

The capacitor metal wiring layers CM1 through CM9 may be electrically connected to one another via the capacitor metal vias CV1 through CV9. A contact pad may be formed on the topmost capacitor metal wiring layer CM9. The numbers of the capacitor metal wiring layers CM1 through CM9 and the capacitor metal vias CV1 through CV9 are just examples for convenience of explanation. Furthermore, the numbers of the capacitor metal vias CV1 through CV9 formed on the inter-metal insulation layers 206 are also just examples for convenience of explanation.

The dielectric pattern 276 and the inter-metal insulation layer 206 may be formed of an oxide, an organo-silicate glass, an organic material, an inorganic material, a low-K material, or a super low-K material. The low-K material may refer to a material with a dielectric constant less than 4. The super low-K material may refer to a material with a dielectric constant less than 2.5. The dielectric pattern 276 and the inter-metal insulation layer 206 may be formed of a porous material or a non-porous material.

The capacitor metal wiring layers CM1 through CM9 and the capacitor metal vias CV1 through CV9 may be formed of copper, tungsten, aluminum, silver, gold, or an alloy thereof. The semiconductor substrate 202 may be a silicon substrate, a silicon-on-insulator (SOI) substrate, a gallium arsenic substrate, or a silicon germanium substrate.

Figure 12:
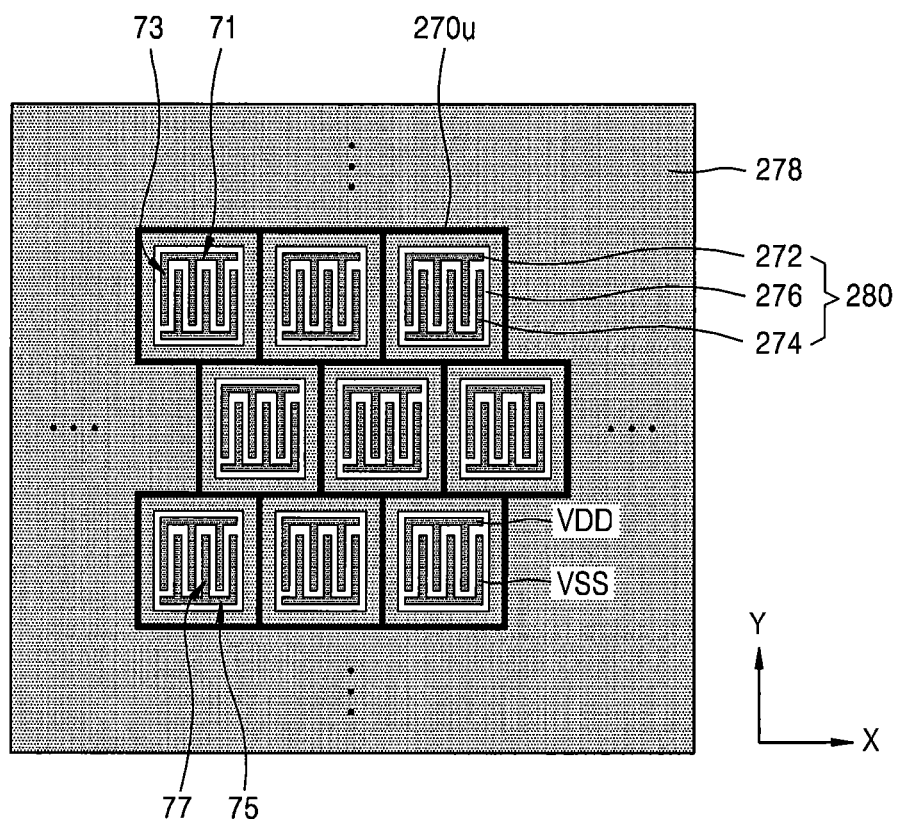
FIG. 12 is a plan view of a decoupling capacitor region of a semiconductor device according to example embodiments.

FIG. 12 is a plan view of a decoupling capacitor region of a semiconductor device according to example embodiments.

In detail, FIG. 12 may be a schematic diagram showing the decoupling capacitor region 270 of FIG. 3. The decoupling capacitor region 270 may include the plurality of unit decoupling capacitor regions 270u. FIG. 12 shows one decoupling capacitor layer (one from among DC1 through DC5 of FIG. 11. FIG. 12 shows one capacitor metal wiring layer (one from among CM1 through CM5 of FIG. 11).

As described above, the decoupling capacitor layer (one from among DC1 through DC5) and the capacitor metal wiring layer (one from among CM1 through CM5) may include the first capacitor metal wiring pattern 272 and the second capacitor metal wiring pattern 274. The dielectric pattern 276 may be arranged between the first capacitor metal wiring pattern 272 and the second capacitor metal wiring pattern 274.

The first capacitor metal wiring pattern 272 may include a first base pattern 71 arranged in a first direction (e.g., the x-axis direction) and a plurality of first extending patterns 73, which extend from the first base pattern 71 in a second direction perpendicular to the first direction (e.g., the y-axis direction) and are spaced apart from one another. The second capacitor metal wiring pattern 274 may include a second base pattern 75, which faces the first base pattern 71 in the second direction and is arranged in the first direction, and a plurality of second extending patterns 77, which extend from the second base pattern 75 into spaces between the first extending patterns 73 in the second direction and are spaced apart from one another.

The first capacitor metal wiring pattern 272, the second capacitor metal wiring pattern 274, and the dielectric patterns 276 constitute the decoupling capacitor 280. The first capacitor metal wiring pattern 272 may be connected to a high power supply line (that is, VDD), whereas the second capacitor metal wiring pattern 274 may be connected to a low power supply line (that is, VSS). In FIG. 12, the reference numeral 278 denotes a metal layer.

Figure 13:
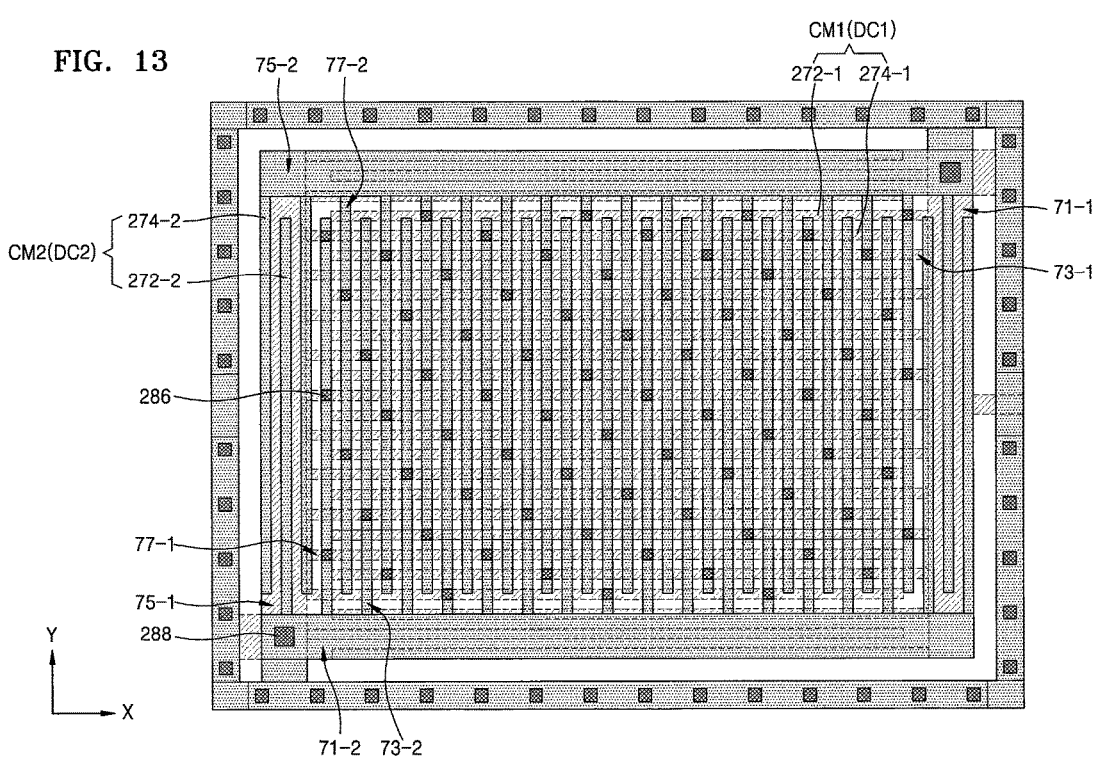
FIG. 13 is a plan view of a decoupling capacitor region of a semiconductor device according to example embodiments.

FIG. 13 is a plan view of a decoupling capacitor region of a semiconductor device according to example embodiments.

In detail, FIG. 13 is a diagram showing the decoupling capacitor region 270 of FIG. 3. FIG. 13 is a plan view of a stack of two decoupling capacitor layers (two decoupling capacitor layers from among DC1 through DC5 of FIG. 11). Hereinafter, an upper layer and a lower layer from among the decoupling capacitor layers DC1 through DC5 are referred to as a first decoupling capacitor layer DC1 and a second decoupling capacitor layer DC2, respectively. Furthermore, an upper layer and a lower layer from among the capacitor metal wiring layers CM1 through CM5 are referred to as a first capacitor metal wiring layer CM1 and a second capacitor metal wiring layer CM2, respectively.

The first decoupling capacitor layer DC1 and the first capacitor metal wiring layer CM1 may include a first capacitor metal wiring pattern 272-1 and a second capacitor metal wiring pattern 274-1. The first capacitor metal wiring pattern 272-1 may include a first base pattern 71-1 extending in the y-axis direction and a plurality of first extending patterns 73-1 extending from the first base pattern 71-1 in the x-axis direction. The second capacitor metal wiring pattern 274-1 may include a second base pattern 75-1 facing the first base pattern 71-1 and a plurality of second extending patterns 77-1 extending from the second base pattern 75-1 into spaces between the first extending patterns 73-1.

The second decoupling capacitor layer DC2 and the second capacitor metal wiring layer CM2 may include a first capacitor metal wiring pattern 272-2 and a second capacitor metal wiring pattern 274-2. The first capacitor metal wiring pattern 272-2 may include a first base pattern 71-2 extending in the x-axis direction and a plurality of first extending patterns 73-2 extending from the first base pattern 71-2 in the y-axis direction. The second capacitor metal wiring pattern 274-2 may include a second base pattern 75-2 facing the first base pattern 71-2 and a plurality of second extending patterns 77-2 extending from the second base pattern 75-2 into spaces between the first extending patterns 73-2.

Figure 14:
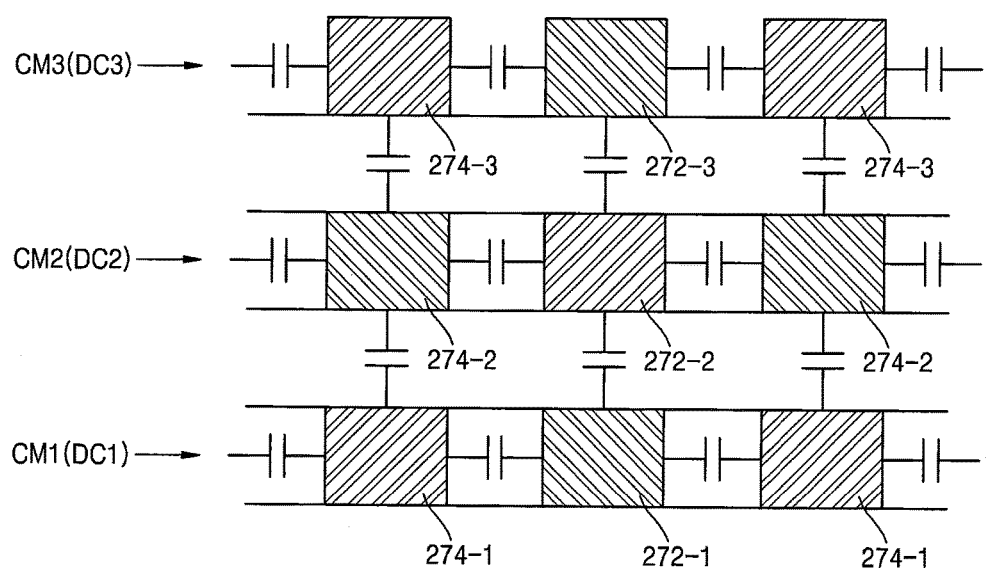
FIG. 14 is a sectional view of a portion of a decoupling capacitor region of a semiconductor device according to example embodiments.

FIG. 14 is a sectional view of a portion of a decoupling capacitor region of a semiconductor device according to example embodiments.

In detail, the decoupling capacitor region (270 of FIG. 3) may be formed by stacking a plurality of decoupling capacitors DC1 through DC3 or a plurality of capacitor metal wiring layers CM1 through CM3. The decoupling capacitors DC1 through DC3 or the capacitor metal wiring layers CM1 through CM3 may include first capacitor metal wiring patterns 272-1, 272-2, and 272-3 and second capacitor metal wiring patterns 274-1, 274-2, and 274-3.

Decoupling capacitors may be horizontally and/or vertically formed between the first capacitor metal wiring patterns 272-1, 272-2, and 272-3 and the second capacitor metal wiring patterns 274-1, 274-2, and 274-3. The first capacitor metal wiring patterns 272-1, 272-2, and 272-3 and the second capacitor metal wiring patterns 274-1, 274-2, and 274-3 may be connected to a high power supply line and a low power supply line, respectively.

Figure 15:
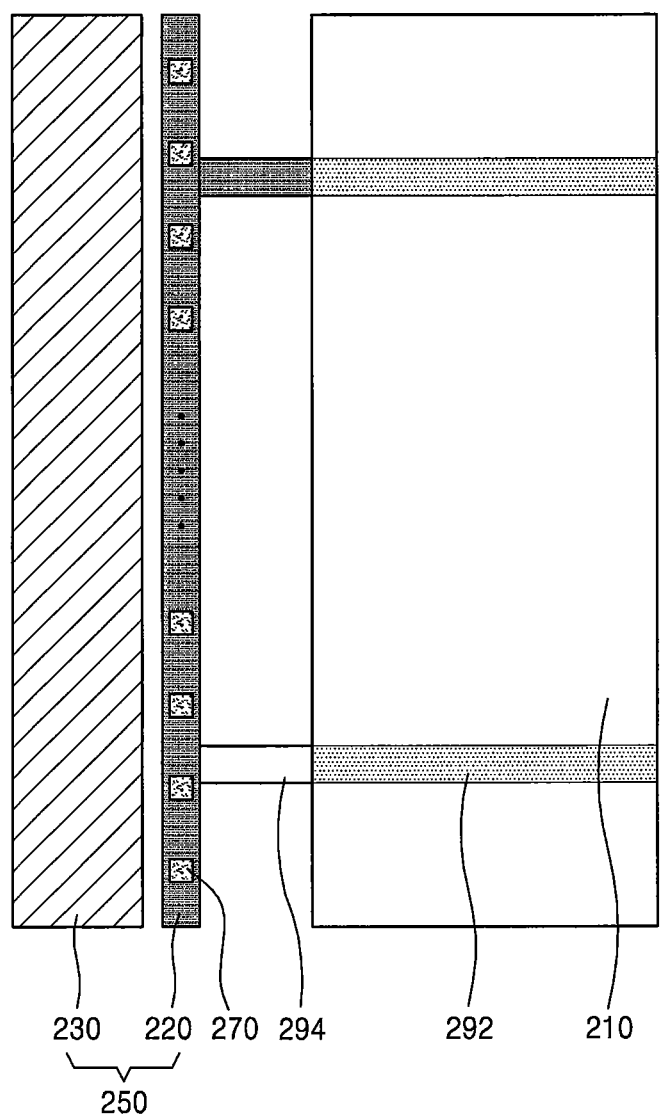
FIGS. 15 and 16 are plan views illustrating an electric connection between an internal circuit and a decoupling capacitor region of a semiconductor device according to example embodiments.
Figure 16:
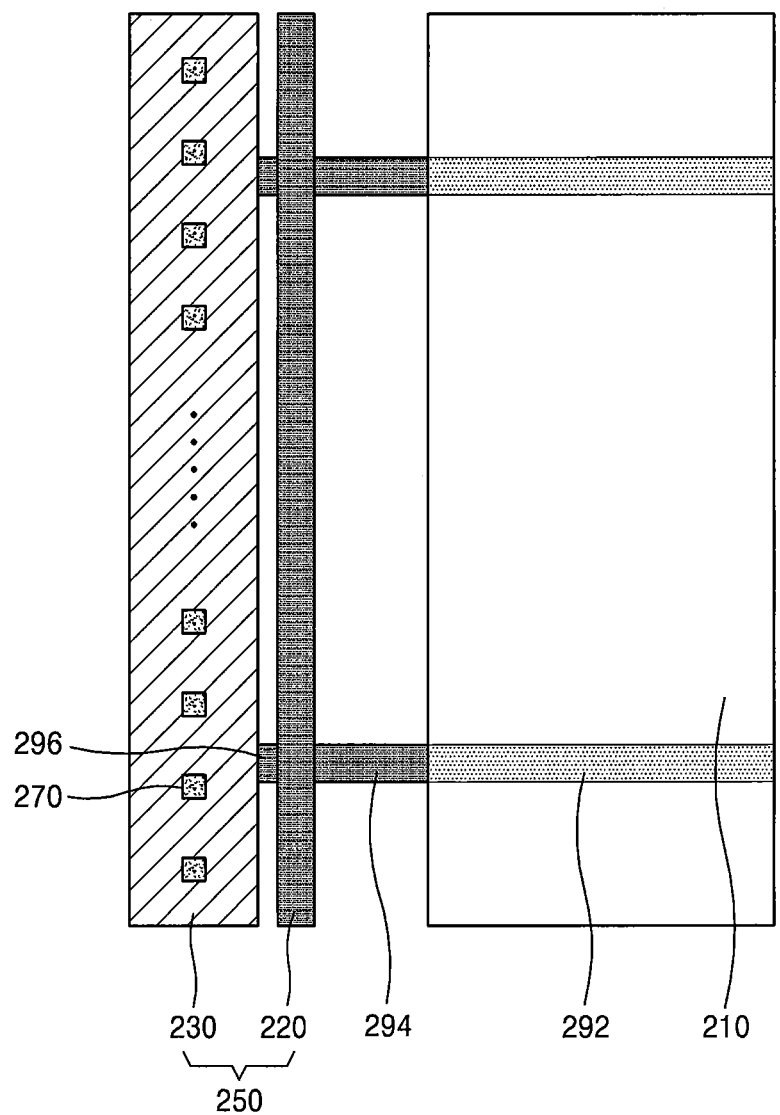

FIGS. 15 and 16 are plan views illustrating an electric connection relationship between an internal circuit and a decoupling capacitor region of a semiconductor device according to example embodiments.

In detail, FIG. 15 shows a first connection metal wiring layer 294 electrically interconnecting an internal metal wiring layer 292 of the internal circuit 210 and the decoupling capacitor region 270 formed in the moisture oxidation barrier region 220 constituting the sealing region 250. The first connection metal wiring layer 294 may be connected to the internal metal wiring layer 292 and may extend to the outside. The first connection metal wiring layer 294 may be electrically connected to a capacitor metal wiring layer formed in the moisture oxidation barrier region 220.

FIG. 16 shows the first connection metal wiring layer 294 and a second connection metal wiring layer 296 electrically interconnecting the internal metal wiring layer 292 of the internal circuit 210 and the decoupling capacitor region 270 formed in the crack stop region 230 constituting the sealing region 250. The second connection metal wiring layer 296 may extend from the moisture oxidation barrier region 220 and may be electrically connected to a capacitor metal wiring layer in the crack stop region 230.

Figure 17:
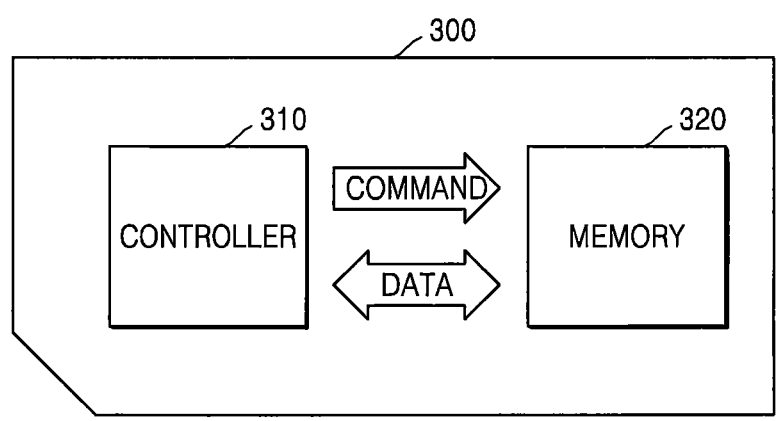
FIG. 17 is a block diagram of a memory card including a semiconductor device according to example embodiments.

FIG. 17 is a block diagram of a memory card including a semiconductor device according to example embodiments.

In detail, the memory card 300 may include a controller 310, which generates commands and address signals, and a memory 320, e.g., one or a plurality of flash memories. In the memory card 300, the controller 310 and the memory 320 may be arranged to exchange electric signals with each other. The controller 310 and/or the memory 320 may include a semiconductor device according to one of example embodiments. The memory 320 may include a memory array (not shown) or a memory array bank (not shown).

The memory card 300 may be used in various types of card-type memory devices, such as a memory stick card, a smart media (SM) card, a secure digital (SD) card, a mini secure digital (mini SD) card, or a multimedia card (MMC).

Figure 18:
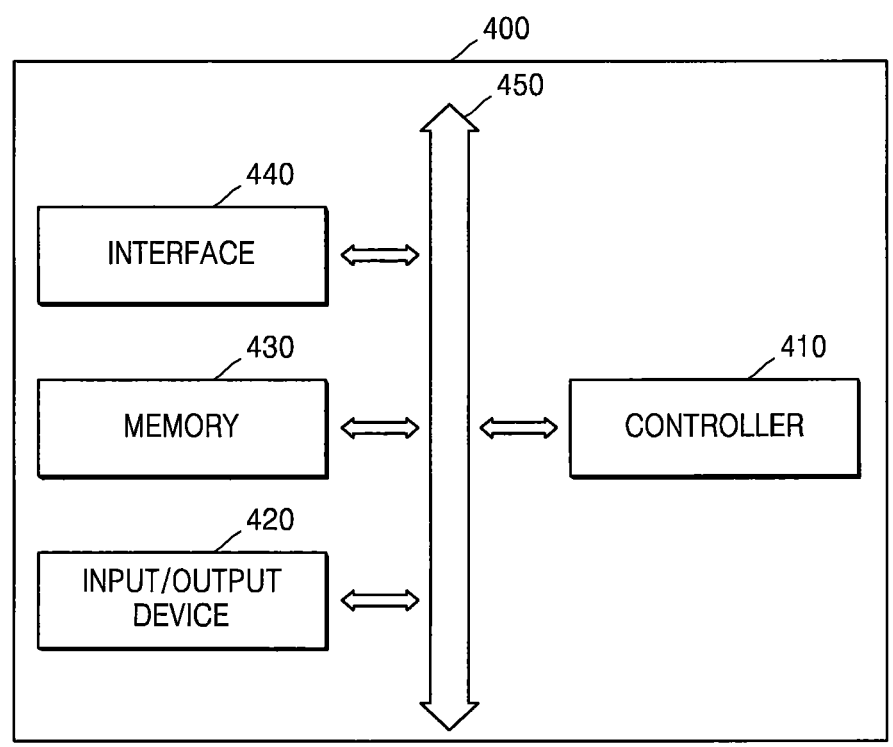
FIG. 18 is a block diagram of an electronic system including a semiconductor device according to example embodiments.

FIG. 18 is a block diagram of an electronic system including a semiconductor device according to example embodiments.

In detail, the electronic system 400 may include a controller 410, an input/output device 420, a memory 430, and an interface 440. The electronic system 400 may be a mobile system or a system for transmitting/receiving data. The mobile system may be a personal digital assistant (PDA), a portable computer, a web tablet, a wireless phone, a mobile phone, a digital music player, or a memory card.

The controller 410 may execute programs and control the electronic system 400. For example, the controller 410 may be a microprocessor, a digital signal processor, a microcontroller, or the like. The input/output device 420 may be used to input or output data to and from the electronic system 400.

The electronic system 400 may be connected to an external device, e.g., a personal computer or a network, and exchange data with the external device by using the input/output device 420. For example, the input/output device 420 may be a keypad, a keyboard, or a display device. The memory 430 may store codes and/or data for operating the controller 410 and/or store data processed by the controller 410. The controller 410 and the memory 430 may include a semiconductor according to one of embodiments. The interface 440 may be a data transmission path between the electronic system 400 and an external device. The controller 410, the input/output device 420, the memory 430, and the interface 440 may communicate with one another via a bus 450.

For example, the electronic system 400 may be used in a mobile phone, a MP3 player, a navigation device, a portable multimedia player (PMP), a solid state disk (SSD), or a household appliance.

Figure 19:
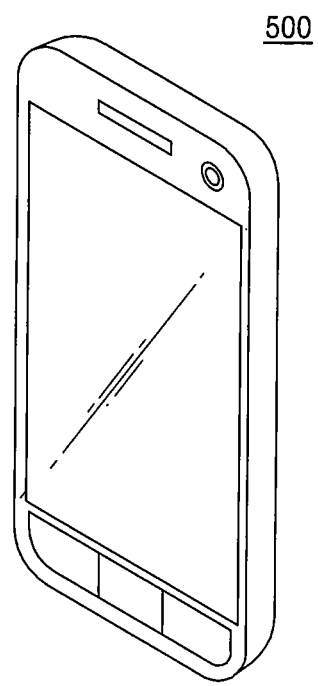
FIG. 19 is a perspective view of an electronic system including a semiconductor device according to example embodiments.

FIG. 19 is a perspective view of an electronic system including a semiconductor device according to example embodiments.

In detail, FIG. 19 shows an example in which the electronic system (400 of FIG. 18) is applied to a mobile phone 500. Furthermore, the electronic system 400 may be applied to a portable laptop PC, a MP3 player, a navigation device, a SSD, a automobile, or a household appliance.

As described above, according to the one or more of the above example embodiments, a decoupling capacitor region including decoupling capacitors is formed in a sealing region in a semiconductor device according to an embodiment. In other words, the decoupling capacitor region may be formed in at least one of a crack stop region and a moisture oxidation barrier region constituting the sealing region.

Device efficiency of a semiconductor device according to the one or more of the above example embodiments may be improved by arranging a decoupling capacitor region in a sealing region located at the outer portion of the semiconductor device. Furthermore, since it is not necessary to form a decoupling capacitor region in an internal circuit in a semiconductor device according to the one or more of the above example embodiments, size of the internal circuit may be reduced, and thus device size (chip size) may be reduced and design efficiency may be improved.

It should be understood that the example embodiments described herein should be considered in a descriptive sense only and not for purposes of limitation. Descriptions of features or aspects within each of the example embodiments should typically be considered as available for other similar features or aspects in other example embodiments.

While several example embodiments have been described with reference to the figures, it will be understood by those of ordinary skill in the art that various changes in form and details may be made therein without departing from the spirit and scope as defined by the following claims.

What is claimed is:

1. A semiconductor device comprising:
an internal circuit on a substrate, the internal circuit comprising a plurality of internal metal wiring layers;
a sealing region on the substrate, the sealing region surrounding the internal circuit;
a decoupling capacitor region in the sealing region, the decoupling capacitor region comprising a plurality of capacitor metal wiring layers stacked on the substrate; and a connecting metal wiring layer connecting one of the plurality of capacitor metal wiring layers to one of the plurality of internal metal wiring layers, wherein the sealing region comprises a crack stop region that comprises a plurality of first metal vias and an inter-metal insulation pattern between the plurality of first metal vias, wherein the inter-metal insulation pattern is enclosed by the plurality of first metal vias in a plan view, wherein the substrate comprises an impurity region underlying the decoupling capacitor region, and wherein the decoupling capacitor region further comprises a capacitor via that contacts the impurity region and a lowermost one of the plurality of capacitor metal wiring layers.

2. The semiconductor device of claim 1, wherein the sealing region further comprises a moisture oxidation barrier region surrounding the internal circuit, and wherein the crack stop region is spaced apart from the moisture oxidation barrier region and surrounds the moisture oxidation barrier region.

3. The semiconductor device of claim 2, further comprising a crack stop aiding region that is in the crack stop region.

4. The semiconductor device of claim 2, wherein the decoupling capacitor region is in the crack stop region or the moisture oxidation barrier region.

5. The semiconductor device of claim 1, wherein the decoupling capacitor region comprises a plurality of decoupling capacitors, and wherein each of the plurality of decoupling capacitors comprises:
a first capacitor metal wiring pattern connected to a high power supply line;
a second capacitor metal wiring pattern that is spaced apart from the first capacitor metal wiring pattern and is connected to a low power supply line; and
a dielectric pattern between the first capacitor metal wiring pattern and the second capacitor metal wiring pattern.

6. The semiconductor device of claim 5, wherein the first capacitor metal wiring pattern comprises a first base pattern extending in a first direction and a plurality of first extending patterns that extend from the first base pattern in a second direction perpendicular to the first direction and are spaced apart from one another, wherein the second capacitor metal wiring pattern comprises a second base pattern that faces the first base pattern and extends in the first direction and a plurality of second extending patterns that extend from the second base pattern in the second direction and are spaced apart from one another, and wherein one of the plurality of second extending patterns is between first and second ones of the plurality of first extending patterns.

7. The semiconductor device of claim 1, wherein the decoupling capacitor region comprises a plurality of unit decoupling capacitor regions that are spaced apart from one another.

8. The semiconductor device of claim 1, wherein the plurality of capacitor metal wiring layers comprise a plurality of capacitor metal wiring patterns, respectively, wherein the plurality of capacitor metal wiring patterns comprise a first capacitor metal wiring pattern and a second capacitor metal wiring pattern that is stacked on the first capacitor metal wiring pattern, wherein the first capacitor metal wiring pattern comprises a first base pattern extending in a first direction and a plurality of first extending patterns that protrude from the first base pattern and extend in a second direction that crosses the first direction, and wherein the second capacitor metal wiring pattern comprises a second base pattern extending in the second direction and a plurality of second extending patterns that protrude from the second base pattern and extend in the first direction.

9. The semiconductor device of claim 1, wherein the crack stop region further comprises a metal wiring layer on the plurality of first metal vias.

10. The semiconductor device of claim 9, wherein the metal wiring layer of the crack stop region comprises a first metal wiring layer, wherein the sealing region further comprises a moisture oxidation barrier region, and wherein the moisture oxidation barrier region comprises a plurality of second metal vias having a linear shape and a second metal wiring layer overlapping the plurality of second metal vias.

11. A semiconductor device comprising:
an internal circuit on a semiconductor substrate;
a sealing region on the semiconductor substrate, the sealing region surrounding the internal circuit; and
a decoupling capacitor region comprising a plurality of capacitor vias and a plurality of decoupling capacitor layers stacked on the semiconductor substrate in the sealing region, wherein each of the plurality of decoupling capacitor layers comprises a plurality of capacitor metal wiring patterns that are spaced apart from one another and a plurality of dielectric patterns, and one of the plurality of dielectric patterns is between first and second ones of the plurality of capacitor metal wiring patterns, wherein the semiconductor substrate comprises an impurity region underlying the decoupling capacitor region, and wherein one of the plurality of capacitor vias contacts the impurity region and a lowermost one of the plurality of decoupling capacitor layers.

12. The semiconductor device of claim 11, wherein the sealing region comprises a moisture oxidation barrier region surrounding the internal circuit and a crack stop region that is spaced apart from the moisture oxidation barrier region and surrounds the moisture oxidation barrier region, and wherein the sealing region comprises:
a plurality of metal wiring layers and a plurality of inter-metal insulation layers stacked in an alternating sequence on the semiconductor substrate; and
a plurality of metal vias in respective ones of the plurality of inter-metal insulation layers, wherein one of the plurality of metal vias connects first and second ones of the plurality of metal wiring layers.

13. The semiconductor device of claim 12, wherein the decoupling capacitor region is in the crack stop region or the moisture oxidation barrier region.

14. The semiconductor device of claim 12, wherein the plurality of capacitor metal wiring patterns comprise:
a plurality of first capacitor metal wiring patterns connected to a high power supply line; and
a plurality of second capacitor metal wiring patterns that are spaced apart from the plurality of first capacitor metal wiring patterns and are connected to a low power supply line, and wherein the one of the plurality of dielectric patterns is between one of the plurality of first capacitor metal wiring patterns and one of the plurality of second capacitor metal wiring patterns.

15. The semiconductor device of claim 11, wherein the internal circuit comprises an internal metal wiring layer, and wherein the semiconductor device further comprises a connecting metal wiring layer that electrically connects one of the plurality of decoupling capacitor layers to the internal metal wiring layer.

16. The semiconductor device of claim 11, wherein the sealing region comprises a crack stop region that comprises a plurality of first metal vias and an inter-metal insulation pattern between the plurality of first metal vias, and
wherein the inter-metal insulation pattern is enclosed by the plurality of first metal vias in plan view.

* * * * *